(12) United States Patent
Huang et al.

(10) Patent No.: US 10,096,597 B1
(45) Date of Patent: Oct. 9, 2018

(54) RE-GROWN GATE STRUCTURE AND FABRICATION METHOD THEREOF

(71) Applicant: TAIWAN SEMICONDUCTOR MANUFACTURING CO., LTD., Hsinchu (TW)

(72) Inventors: Yu-Xuan Huang, Hsinchu (TW); Ching-Wei Tsai, Hsinchu (TW); Chih-Hao Wang, Hsinchu County (TW); Chung-Cheng Wu, Hsinchu County (TW); Guo-Yung Chen, Hsinchu County (TW); Yi-Hsiung Lin, Hsinchu County (TW); Shang-Wen Chang, Hsinchu County (TW); Yi-Hsun Chiu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/626,204

(22) Filed: Jun. 19, 2017

(51) Int. Cl.
*H01L 27/088* (2006.01)
*H01L 21/8234* (2006.01)

(52) U.S. Cl.
CPC .. *H01L 27/0886* (2013.01); *H01L 21/823418* (2013.01); *H01L 21/823462* (2013.01); *H01L 21/823481* (2013.01)

(58) Field of Classification Search
CPC ......... H01L 27/0886; H01L 21/823418; H01L 21/823462; H01L 21/823481
See application file for complete search history.

(56) References Cited

U.S. PATENT DOCUMENTS

| 9,576,954 B1* | 2/2017 | Greene ............. H01L 29/42368 |
| 2009/0101975 A1* | 4/2009 | Holz ............... H01L 21/823418 |
| | | 257/347 |

* cited by examiner

*Primary Examiner* — Walter H Swanson
(74) *Attorney, Agent, or Firm* — McClure, Qualey & Rodack, LLP

(57) ABSTRACT

A semiconductor device and a method for fabricating the semiconductor device are provided. The semiconductor device includes a semiconductor substrate, a gate structure including a gate dielectric layer and a first gate electrode layer, and a second gate electrode layer. In the method for fabricating the semiconductor device, at first, the semiconductor substrate is provided. The semiconductor substrate includes fin portions. Then, a gate dielectric layer is formed on the fin portions. Thereafter, a first gate electrode layer is formed on the gate dielectric layer. Then, the first gate electrode layer is etched. Thereafter, a second electrode layer is formed on the first gate electrode layer. Therefore, the gate electrode layer formed on the gate dielectric layer is regrown with easy control.

20 Claims, 12 Drawing Sheets

US 10,096,597 B1

RE-GROWN GATE STRUCTURE AND FABRICATION METHOD THEREOF

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
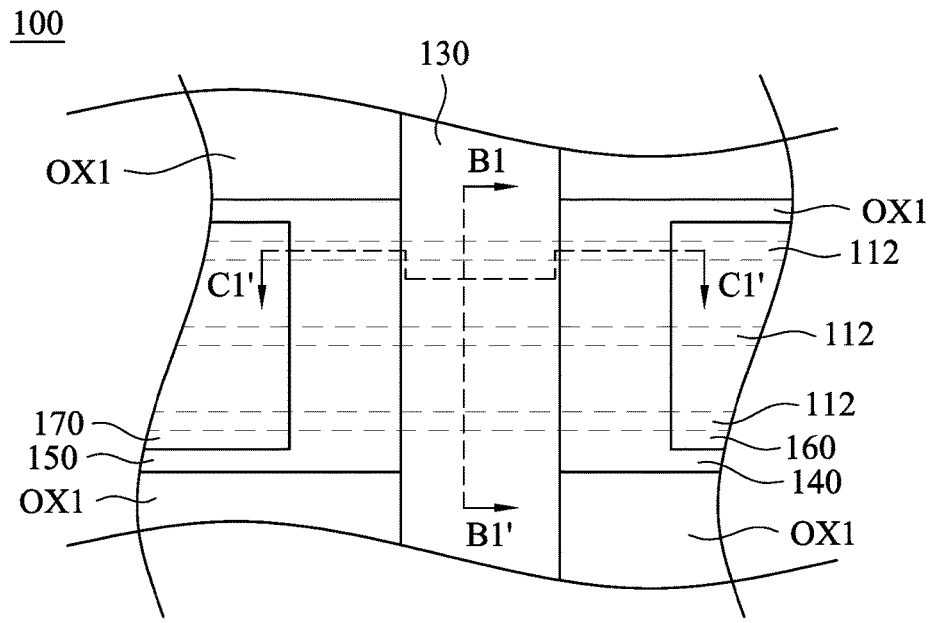
FIG. 1A is a schematic top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a semiconductor device and a fabrication method for fabricating the semiconductor device. The semiconductor device includes a semiconductor substrate, a gate structure including a first gate electrode layer, and a second gate electrode layer. In the fabrication method for fabricating the semiconductor device, at first, the first gate electrode layer is formed on fin portions of the semiconductor device, in which the first gate electrode layer includes first portions formed in gaps between the fin portions. Then, a second portion of the first gate electrode layer is etched to decrease a thickness of the first gate electrode layer, in which the second portion is located on the first portions and covers top surfaces of the fin portions. Thereafter, the second gate electrode layer is formed on the first gate electrode layer.

Figure 1B:
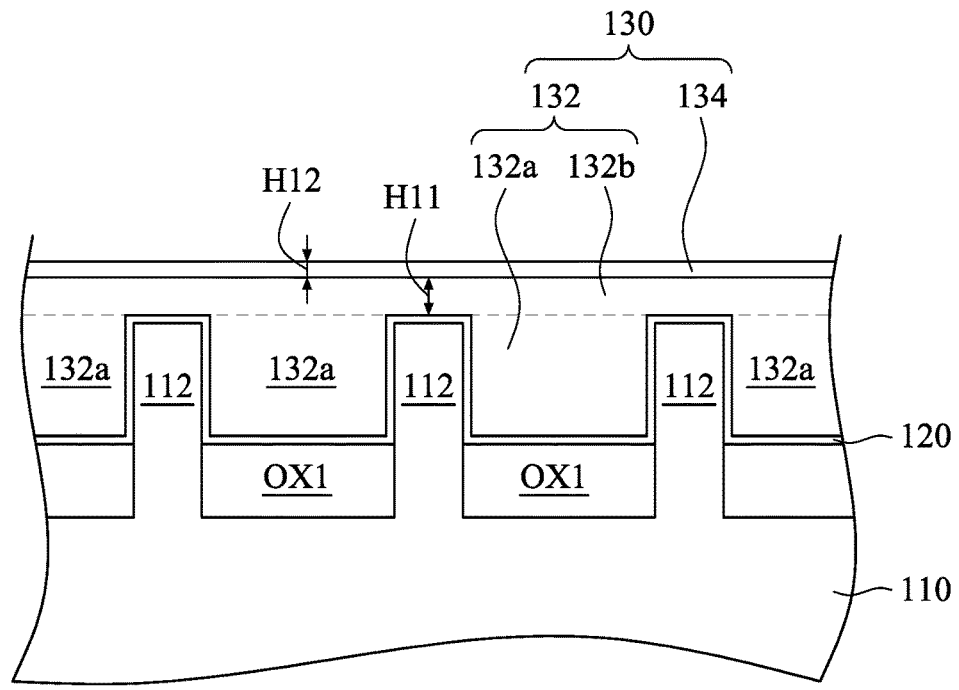
FIG. 1B is a schematic cross-sectional view along a cut line B1-B1' in FIG. 1A.
Figure 1C:
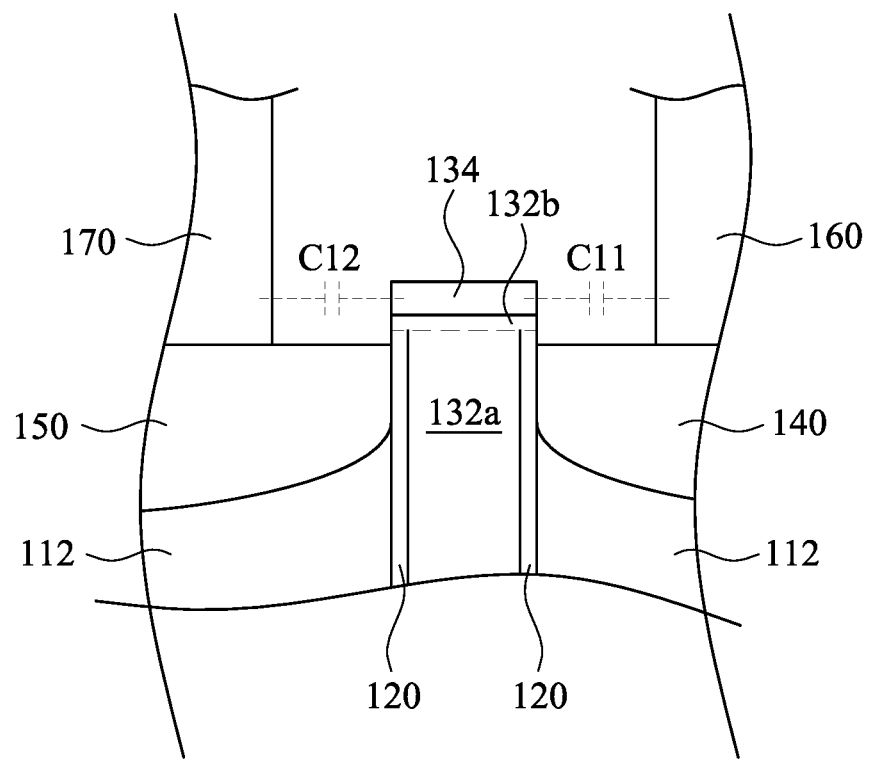
FIG. 1C is a schematic cross-sectional view along a cut line C1-C1' in FIG. 1A.

Referring to FIG. 1A to FIG. 1C, FIG. 1A is a schematic top view of a semiconductor device 100 in accordance with some embodiments of the present disclosure, FIG. 1B is a schematic cross-sectional view along a cut line B1-B1' in FIG. 1A, and FIG. 1C is a schematic cross-sectional view along a cut line C1-C1' in FIG. 1A. The semiconductor device 100 includes a semiconductor substrate 110, plural oxide layers OX1, a gate dielectric layer 120, a main gate electrode layer 130, a source 140, a drain 150 and contacts 160 and 170.

The semiconductor substrate 110 includes plural fin portions 112. In some embodiments, the semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The oxide layers OX1 are formed on the semiconductor substrate 110. In some embodiments, the oxide layers OX1 are formed in a process for forming shallow trench isolations (STI). In some embodiments, portions of the oxide layers OX1 are located between the fin portions 112.

The gate dielectric layer 120 and the main gate electrode layer 130 are sequentially formed on the fin portions 112 to form a gate structure on the fin portions 112. In some embodiments, the gate structure is a high-k metal gate structure. For example, the main gate electrode layer 130 can be formed by metal, and the gate dielectric layer 120 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

The main gate electrode layer 130 includes a first electrode layer 132 and a second electrode layer 134. The first electrode layer 132 is formed on the gate dielectric layer 120 and covers the gate dielectric layer 120, and the second electrode layer 134 is formed on the first electrode layer 132 and contacts the first electrode layer 132. The first electrode layer 132 includes first portions 132a disposed in gaps defined by the fin portions 112 and a second portion 132b disposed on the first portions 132a. The second portion 132b of the first electrode layer 132 has a thickness H11, and the second electrode layer 134 has a thickness H12. In some embodiments, a sum of the thickness H11 and the thickness H12 is greater than zero and smaller than or equal to 100 nanometer. In some embodiments, the first electrode layer 132 can be made by a material the same as or different from a material of the second electrode layer 134. In some embodiments, the first electrode layer 132 and the second electrode layer 134 can be made by tungsten (W), cobalt (Co), copper (Cu), titanium (Ti), tantalum (Ta), titanium nitride (TiN), tantalum nitride (TaN) and silicide. However, embodiments of the present disclosure are not limited thereto.

The source 140 and the drain 150 are disposed on the semiconductor substrate 110 to contact the fin portions 112. The source 140 and the drain 150 are located at opposite sides of the gate structure. In some embodiments, the source 140 and the drain 150 are formed by using an epitaxial process to cover portions of the fin portions 112.

The contacts 160 and 170 are respectively disposed on the source 140 and the drain 150 to provide paths for electric signals. As shown in FIG. 1C, because the second portion 132b of the first electrode layer 132 and the second electrode layer 134 are disposed between the contacts 160 and 170 (referred to as "protrusion electrode layer"), a capacitance C11 is induced by the contact 160 and the protrusion electrode layer, and a capacitance C12 is induced by the contact 170 and the protrusion electrode layer. In the above embodiments, the thickness of the protrusion electrode layer (the sum of the thickness H11 and the thickness H12) is designed to be greater than zero and smaller than or equal to 100 nanometer to decrease the capacitance C11 and the capacitance C12, and RC delay is decreased accordingly.

Figure 2A:
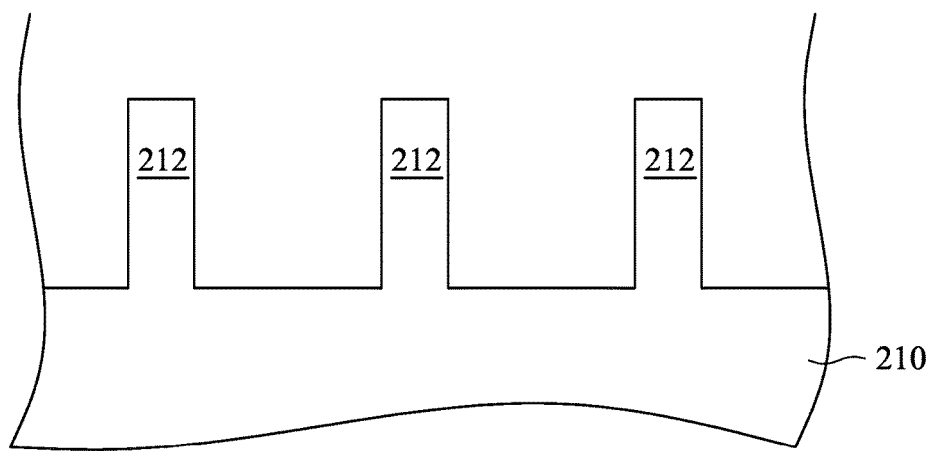
FIG. 2A to FIG. 2F are cross-sectional views of intermediate stages showing a method for fabricating a transistor device in accordance with some embodiments of the present disclosure.

Referring to FIG. 2A to FIG. 2F, FIG. 2A to FIG. 2F are cross-sectional views of intermediate stages showing a method for fabricating a semiconductor device in accordance with some embodiments of the present disclosure. At first, a semiconductor substrate 210 having plural fin portions 212 is provided, as shown in FIG. 2A. In some embodiments, the semiconductor substrate 210 may be a semiconductor material and may include structures including a graded layer or a buried oxide, for example. In some exemplary examples, the semiconductor substrate 210 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 210 may be an active layer of a semiconductor-on-insulator (SOI) substrate or a multi-layered structure such as a silicon-germanium layer formed on a bulk silicon layer. Further, the fin portions 212 can be formed by a wet etching process or a dry etching process. However, embodiments of the present disclosure are not limited thereto.

Figure 2B:
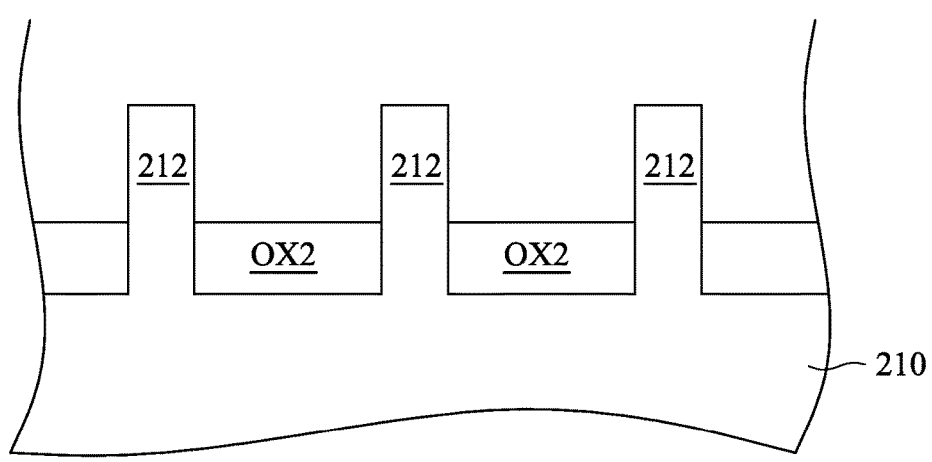

Then, isolation structures (not shown) are formed on the semiconductor substrate 210, as shown in FIG. 2B. In some embodiments, the isolation structures are shallow trench isolations (STI), and plural oxide layers OX2 are used for the shallow trench isolations are formed between the fin portions 212.

Figure 2C:
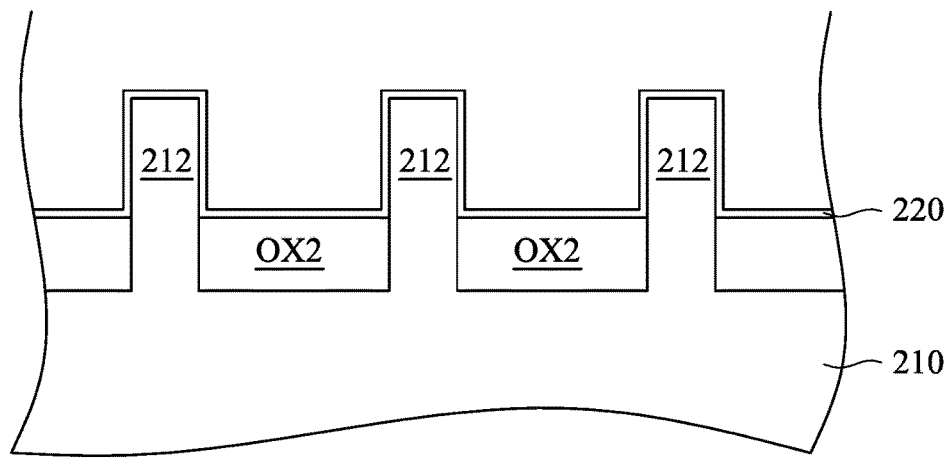

Thereafter, a gate dielectric layer 220 is formed on the fin portions 212 and covers the fin portions 212, as shown in FIG. 2C. In some embodiments, the gate dielectric layer 220 is blanketly deposited on the fin portions 212 and the oxide layers OX2. The deposition process used for forming the gate dielectric layer 220 can be an atomic layer deposition (ALD). Other methods to form the gate dielectric layer 220 include chemical vapor deposition (CVD), physical vapor deposition (PVD), and plasma enhanced chemical vapor deposition (PECVD). In some embodiments, the gate dielectric layer 120 is a high-k dielectric layer including hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

Figure 2D:
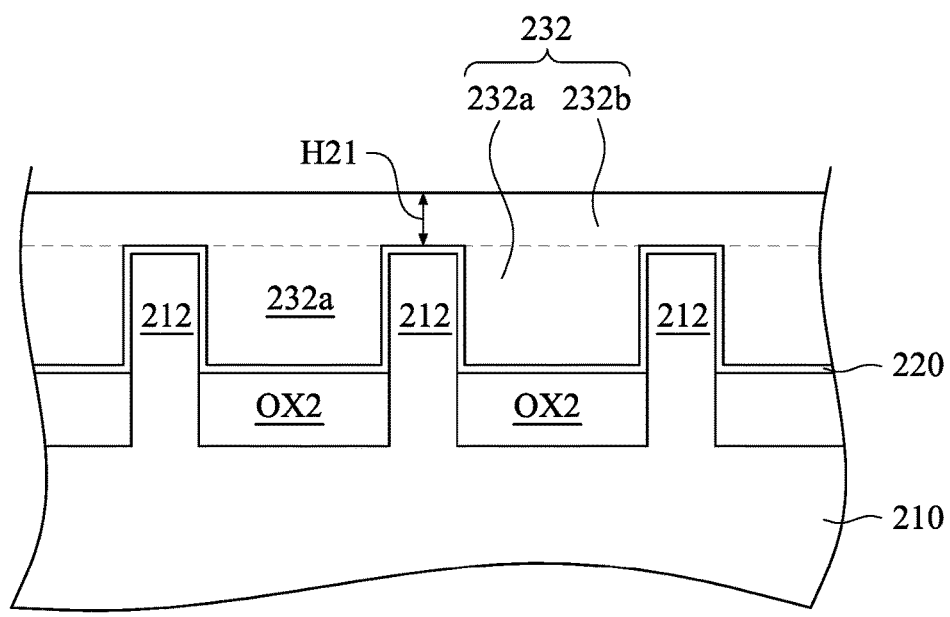

Then, a first gate electrode layer 232 is formed on the gate dielectric layer 220, as shown in FIG. 2D. The first gate electrode layer 232 includes first portions 232a and a second portion 232b. The first portions 232a are formed in the gaps between the fin portions 212, and the second portion 232b is located on the first portions 232a and has a thickness H21. In some embodiments, the thickness H21 is greater than 100 nanometer. In some embodiments, the first gate electrode layer 232 can be formed by using a deposition process, such as an atomic layer deposition (ALD). Other methods to form the first gate electrode layer 232 include chemical vapor deposition (CVD), physical vapor deposition (PVD), and plasma enhanced chemical vapor deposition (PECVD). In some embodiments, the first electrode layer 232 can be made by tungsten (W), cobalt (Co), copper (Cu), titanium (Ti), tantalum (Ta), titanium nitride (TiN), tantalum nitride (TaN) and silicide. However, embodiments of the present disclosure are not limited thereto.

Figure 2E:
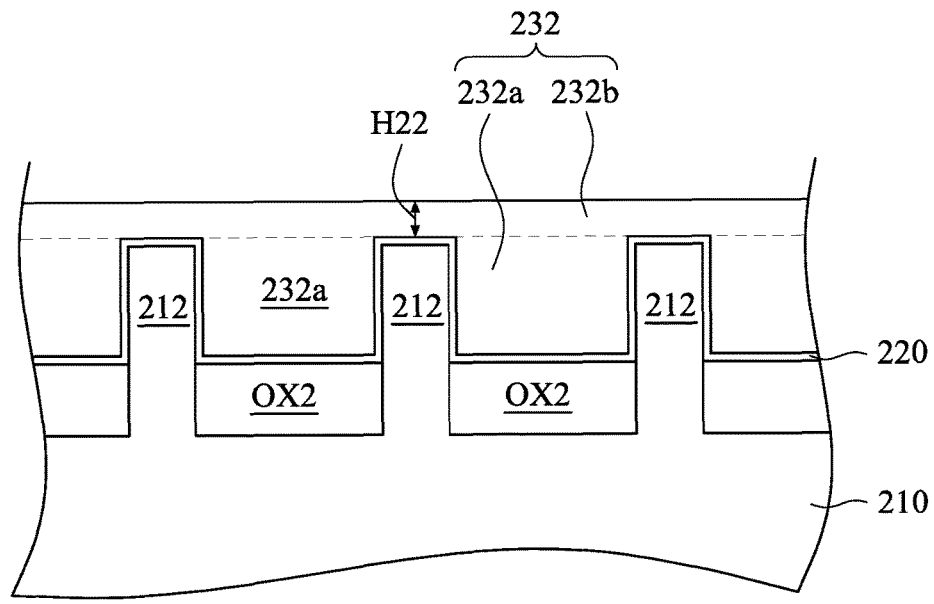

Thereafter, the first gate electrode layer 232 is etched to a thickness H22 smaller than the thickness H21, as shown in FIG. 2E. In some embodiments, the first gate electrode layer 232 can be etched by a wet etching process or a dry etching process. However, embodiments of the present disclosure are not limited thereto.

Figure 2F:
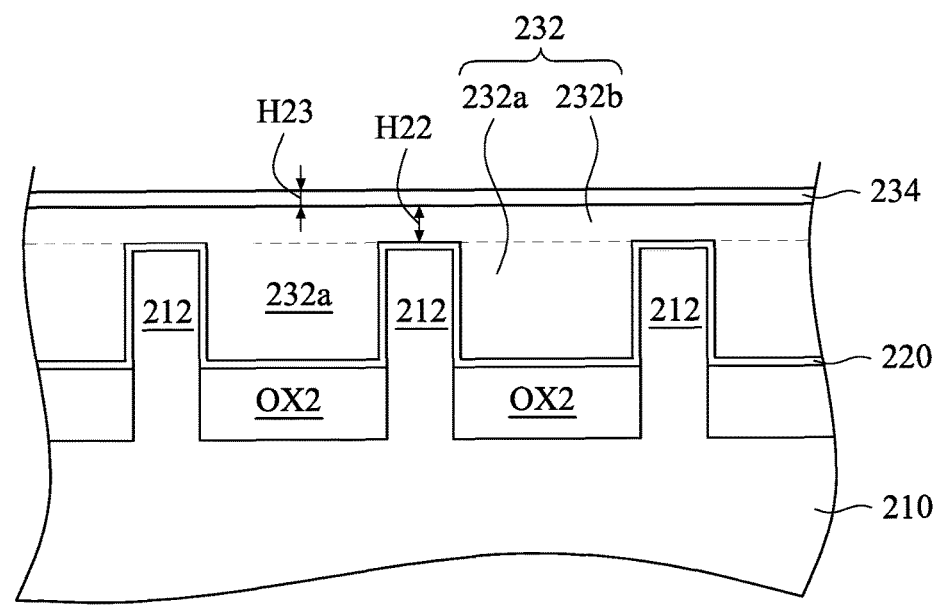

Then, a second gate electrode layer 234 is formed on the first gate electrode layer 232, as shown in FIG. 2F. The second gate electrode layer 234 has a thickness H23, and a sum of the thickness H122 of the etched first gate electrode layer 232 and the thickness H23 of the second gate electrode layer 234 is greater than zero and smaller than or equal to 100 nanometer. In some embodiments, the second gate electrode layer 234 can be formed by using a deposition process, such as an atomic layer deposition (ALD). Other methods to form the second gate electrode layer 234 include chemical vapor deposition (CVD), physical vapor deposition (PVD), and plasma enhanced chemical vapor deposition (PECVD).

Thereafter, a source and a drain (not shown) are formed on the fin portions 212, and contacts formed on the source and the drain, respectively.

Figure 3:
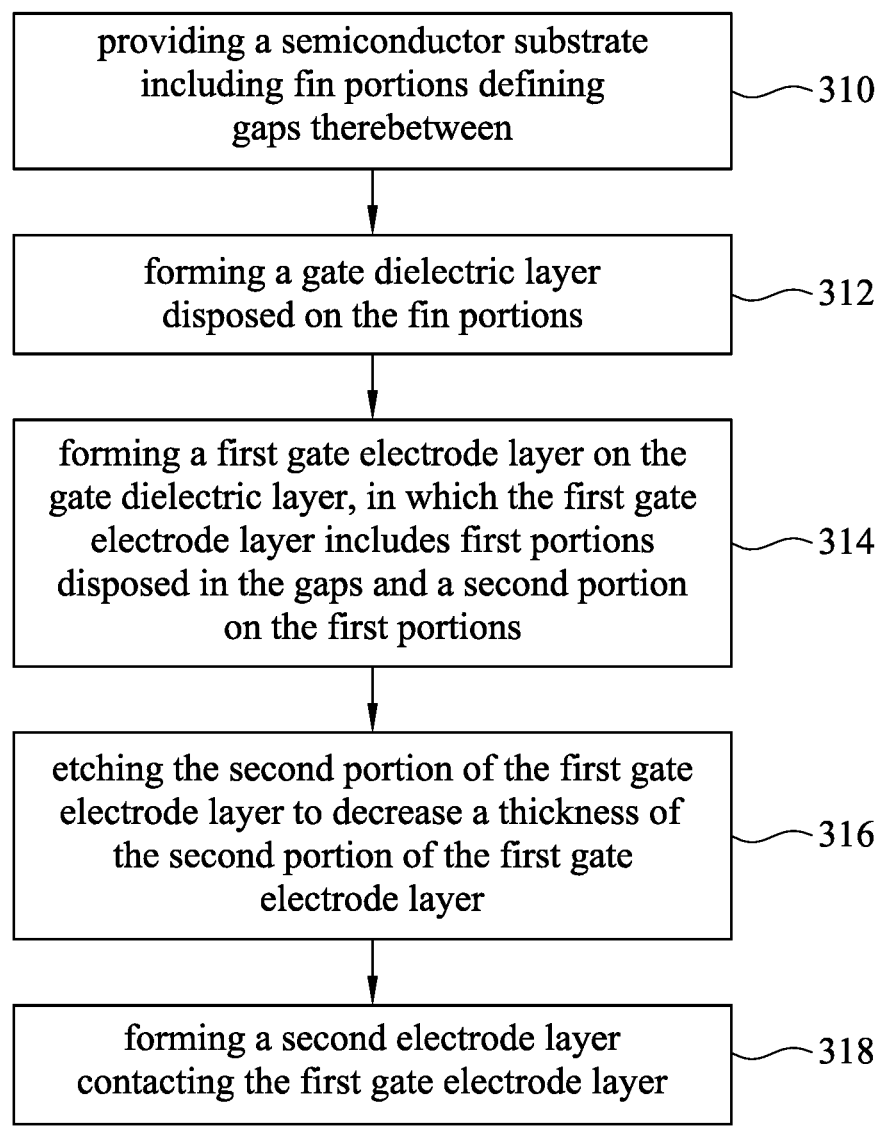
FIG. 3 is a flow chart showing a method for fabricating a semiconductor device in accordance with embodiments of the present disclosure.

Referring to FIG. 3, FIG. 3 is a flow chart showing a method 300 for fabricating a semiconductor device in accordance with embodiments of the present disclosure. The method 300 begins at operation 310. In operation 310, the semiconductor substrate 210 including fin portions 212 is provided as shown in FIG. 2A. The fin portions 212 define plural gaps between the fin portions 212.

Then, in operation 312, the gate dielectric layer 220 is formed on the fin portions 212, as shown in FIG. 2C. In some embodiments, isolation structures can be formed before operation 312 to form the oxide layers OX2 on the semiconductor substrate 210 as shown in FIG. 2B.

Thereafter, in operation 314, the first gate electrode layer 232 is formed on the gate dielectric layer 220, as shown in FIG. 2D. The first gate electrode layer 232 includes the first portions 232a disposed in the gap and the second portion 232b disposed on the first portions 232a.

Then, in operation 316, the second portion 232b of the first gate electrode layer 232 is etched to decrease the thickness of the second portion 232b of the first gate electrode layer 232, as shown in FIG. 2E.

Thereafter, in operation 318, the second electrode layer 234 is formed on the first gate electrode layer 232, as shown in FIG. 2F. In some embodiments, a sum of the thickness H122 of the etched first gate electrode layer 232 and the thickness H23 of the second gate electrode layer 234 is designed to be greater than zero and smaller than or equal to 100 nanometer. Then, the source and the drain are formed on the fin portions 212, and the contacts are formed on the source and the drain, respectively.

It can be understood that the gate electrode layer formed on the gate dielectric layer 220 is etched to have a smaller thickness, and then regrow to have a suitable thickness (smaller than or equal to 100 nanometer) to decrease capacitances induced between the gate electrode layer and the contacts, thereby decreasing RC delay. Further, the regrowth of the gate electrode layer can be controlled easily.

Figure 4A:
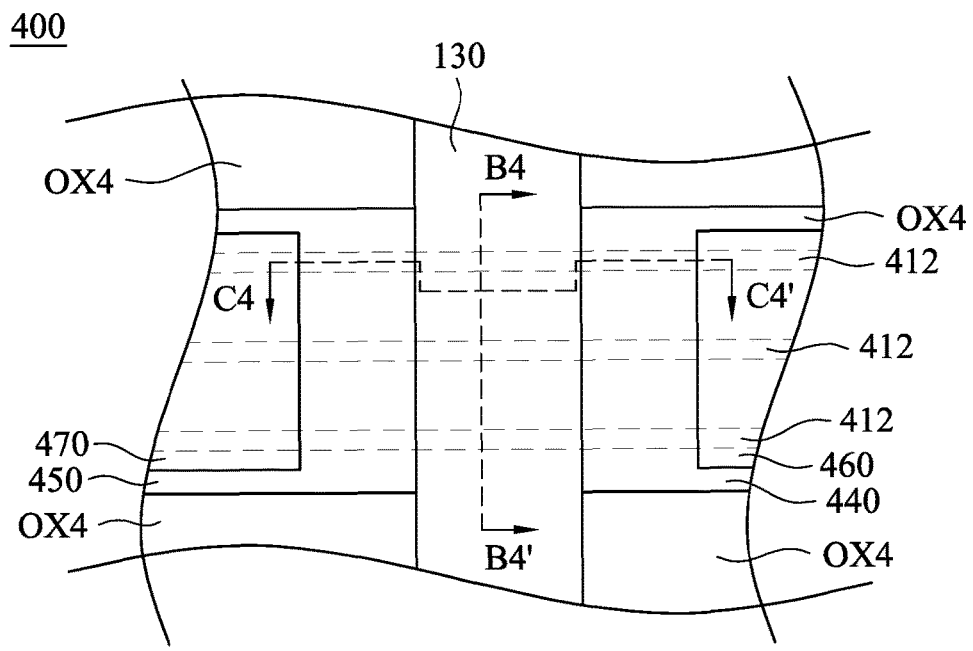
FIG. 4A is a schematic top view of a semiconductor device in accordance with some embodiments of the present disclosure.
Figure 4B:
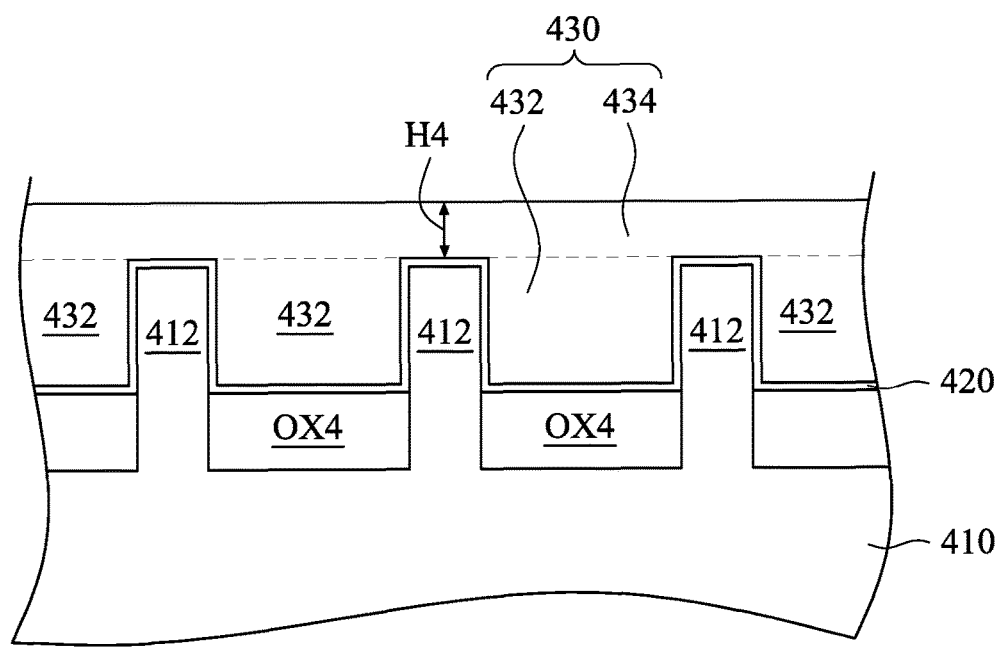
FIG. 4B is a schematic cross-sectional view along a cut line B4-B4' in FIG. 4A.
Figure 4C:
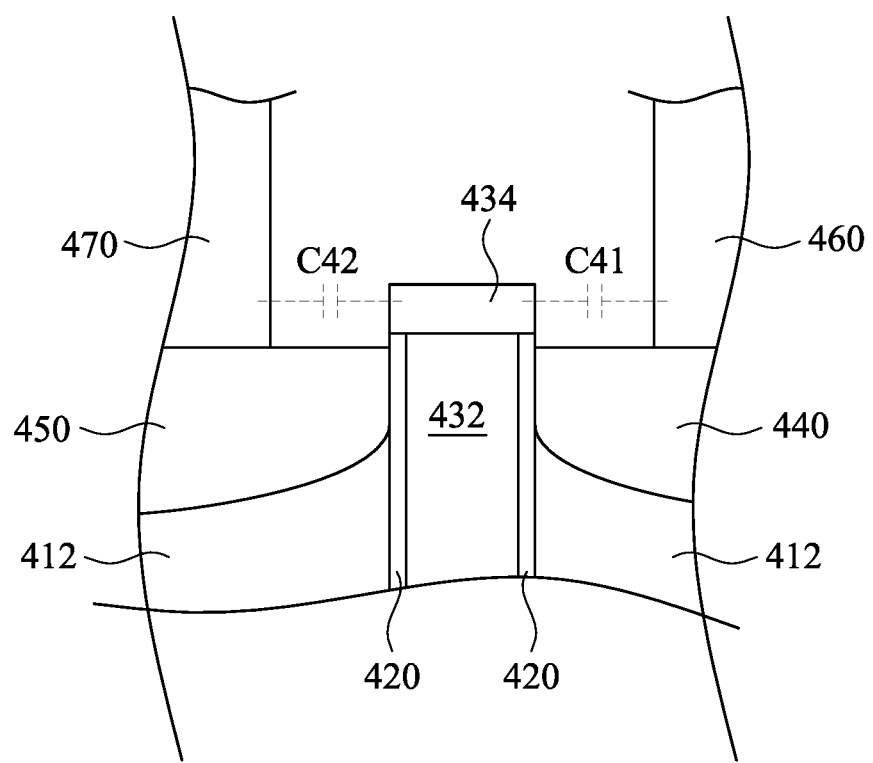
FIG. 4C is a schematic cross-sectional view along a cut line C4-C4' in FIG. 4A.

Referring to FIG. 4A to FIG. 4C, FIG. 4A is a schematic top view of a semiconductor device 400 in accordance with some embodiments of the present disclosure, FIG. 4B is a schematic cross-sectional view along a cut line B4-B4' in FIG. 4A, and FIG. 4C is a schematic cross-sectional view along a cut line C4-C4' in FIG. 4A. The semiconductor device 400 includes a semiconductor substrate 410, plural oxide layers OX4, a gate dielectric layer 420, a main gate electrode layer 430, a source 440, a drain 450 and contacts 460 and 470.

The semiconductor substrate 410 includes plural fin portions 412. In some embodiments, the semiconductor substrate 410 may be a semiconductor material and may include structures including a graded layer or a buried oxide, for example. In some exemplary examples, the semiconductor substrate 410 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 410. Alternatively, the semiconductor substrate 410 may be an active layer of a semiconductor-on-insulator (SOI) substrate or a multi-layered structure such as a silicon-germanium layer formed on a bulk silicon layer.

The oxide layers OX4 are formed on the semiconductor substrate 410. In some embodiments, the oxide layers OX4 are formed in a process for forming shallow trench isolations (STI). In some embodiments, portions of the oxide layers OX4 are located between the fin portions 412.

The gate dielectric layer 420 and the main gate electrode layer 430 are sequentially formed on the fin portions 412 to form a gate structure on the fin portions 412. In some embodiments, the gate structure is a high-k metal gate structure. For example, the main gate electrode layer 430 can be formed by metal, and the gate dielectric layer 420 may include hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, or another suitable material.

The main gate electrode layer 430 includes a first electrode layer 432 and a second electrode layer 434. The first electrode layer 432 is divided into plural portions by the fin portions 412. In other words, the first electrode layer 432 includes portions disposed in the gaps defined by the fin portions 412. The second electrode layer 434 is formed on the first electrode layer 432 and the gate dielectric layer 420, and contacts the first electrode layer 432 and the gate dielectric layer 420. In some embodiments, the second electrode layer 434 has a thickness H4 which is greater than zero and smaller than or equal to 100 nanometer. In some embodiments, the first electrode layer 432 can be made by a material the same as or different from a material of the second electrode layer 434. In some embodiments, the first electrode layer 432 and the second electrode layer 434 can be made by tungsten (W), cobalt (Co), copper (Cu), titanium (Ti), tantalum (Ta), titanium nitride (TiN), tantalum nitride (TaN) and silicide. However, embodiments of the present disclosure are not limited thereto.

The source 440 and the drain 450 are disposed on the semiconductor substrate 410 to contact the fin portions 412. The source 440 and the drain 450 are located at opposite sides of the gate structure. In some embodiments, the source 440 and the drain 450 are formed by using an epitaxial process to cover portions of the fin portions 412.

The contacts 460 and 470 are respectively disposed on the source 440 and the drain 450 to provide paths for electric signals. As shown in FIG. 4C, because the second electrode layer 434 are disposed between the contacts 460 and 470, a capacitance C41 is induced by the contact 460 and the second electrode layer 434, and a capacitance C42 is induced by the contact 470 and the second electrode layer 434. In the above embodiments, the thickness H4 of the second electrode layer 434 is designed to be greater than zero and smaller than or equal to 100 nanometer to decrease the capacitance C41 and the capacitance C42, and RC delay is decreased accordingly.

Figure 5A:
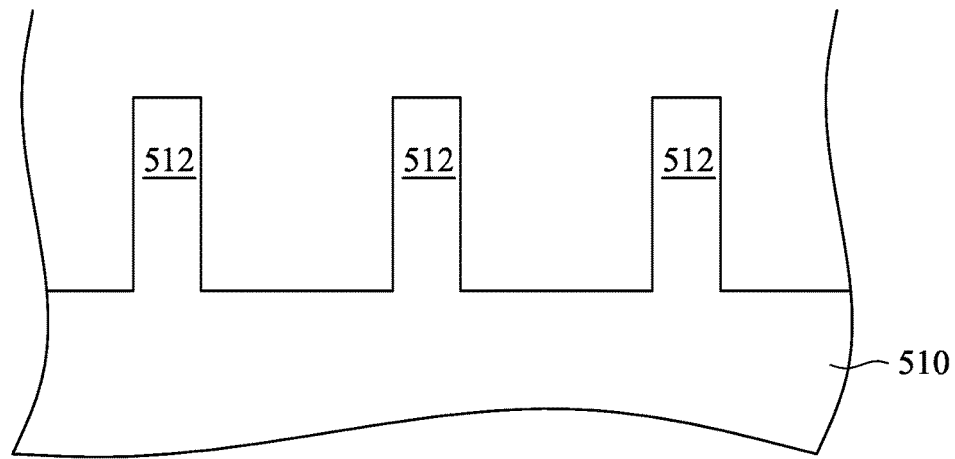
FIG. 5A to FIG. 5F are cross-sectional views of intermediate stages showing a method for fabricating a transistor device in accordance with some embodiments of the present disclosure.

Referring to FIG. 5A to FIG. 5F, FIG. 5A to FIG. 5F are cross-sectional views of intermediate stages showing a method for fabricating a semiconductor device in accordance with some embodiments of the present disclosure. At first, a semiconductor substrate 510 having plural fin portions 512 is provided, as shown in FIG. 5A. In some embodiments, the semiconductor substrate 510 may be a semiconductor material and may include structures including a graded layer or a buried oxide, for example. In some exemplary examples, the semiconductor substrate 510 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 210. Alternatively, the semiconductor substrate 510 may be an active layer of a semiconductor-on-insulator (SOI) substrate or a multi-layered structure such as a silicon-germanium layer formed on a bulk silicon layer. Further, the fin portions 512 can be formed by a wet etching process or a dry etching process. However, embodiments of the present disclosure are not limited thereto.

Figure 5B:
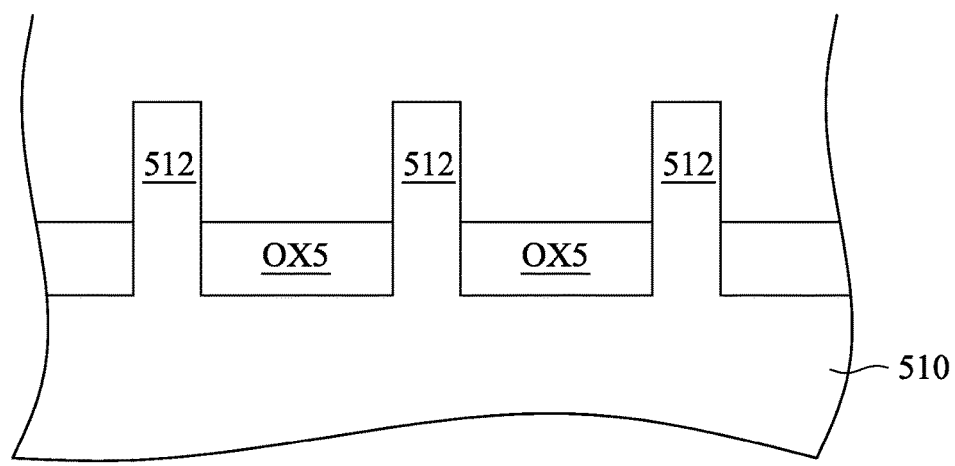

Then, isolation structures (not shown) are formed on the semiconductor substrate 510, as shown in FIG. 5B. In some embodiments, the isolation structures are shallow trench isolations (STI), and plural oxide layers OX5 are used for the shallow trench isolations are formed between the fin portions 512.

Figure 5C:
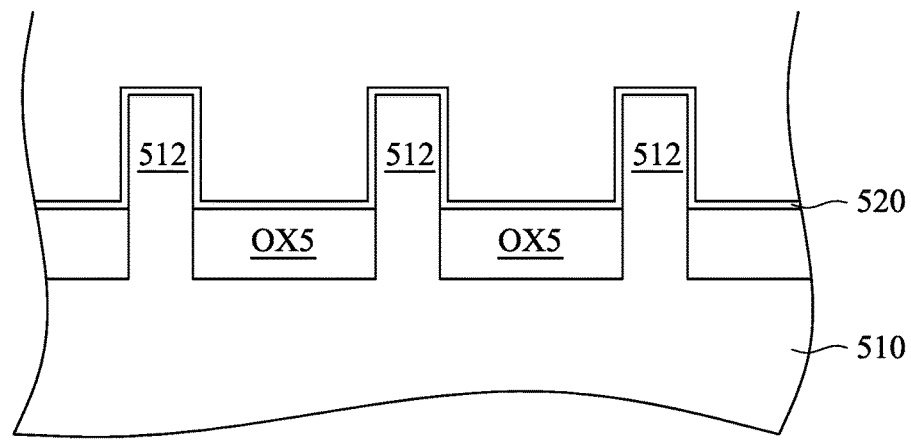

Thereafter, a gate dielectric layer 520 is formed on the fin portions 512 and covers the fin portions 512, as shown in FIG. 5C. In some embodiments, the gate dielectric layer 520 is blanketly deposited on the fin portions 512 and the oxide layers OX5. The deposition process used for forming the gate dielectric layer 520 can be an atomic layer deposition (ALD). Other methods to form the gate dielectric layer 520 include chemical vapor deposition (CVD), physical vapor deposition (PVD), and plasma enhanced chemical vapor deposition (PECVD). In some embodiments, the gate dielectric layer 520 is a high-k dielectric layer including hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfZrO), or another suitable high-k dielectric material. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina (HfO$_2$—Al$_2$O$_3$) alloy, or another suitable material.

Figure 5D:
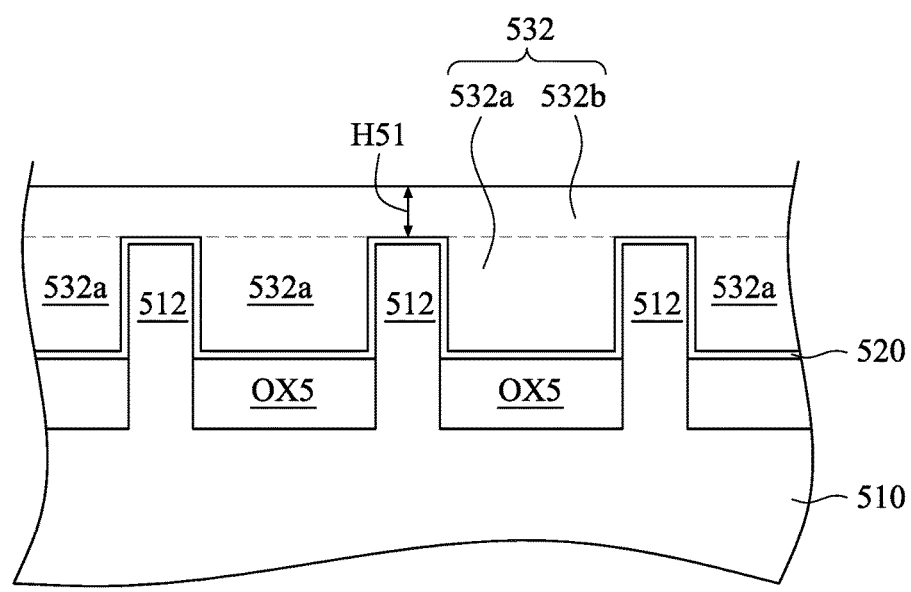

Then, a first gate electrode layer 532 is formed on the gate dielectric layer 520, as shown in FIG. 5D. The first gate electrode layer 532 includes first portions 532a and a second portion 532b. The first portions 532a are formed in the gaps between the fin portions 512, and the second portion 532b is located on the first portions 532a and has a thickness H51. In some embodiments, the thickness H51 is greater than 100 nanometer. In some embodiments, the first gate electrode layer 532 can be formed by using a deposition process, such as an atomic layer deposition (ALD). Other methods to form the first gate electrode layer 532 include chemical vapor deposition (CVD), physical vapor deposition (PVD), and plasma enhanced chemical vapor deposition (PECVD). In some embodiments, the first electrode layer 532 can be made by tungsten (W), cobalt (Co), copper (Cu), titanium (Ti), tantalum (Ta), titanium nitride (TiN), tantalum nitride (TaN) and silicide. However, embodiments of the present disclosure are not limited thereto.

Figure 5E:
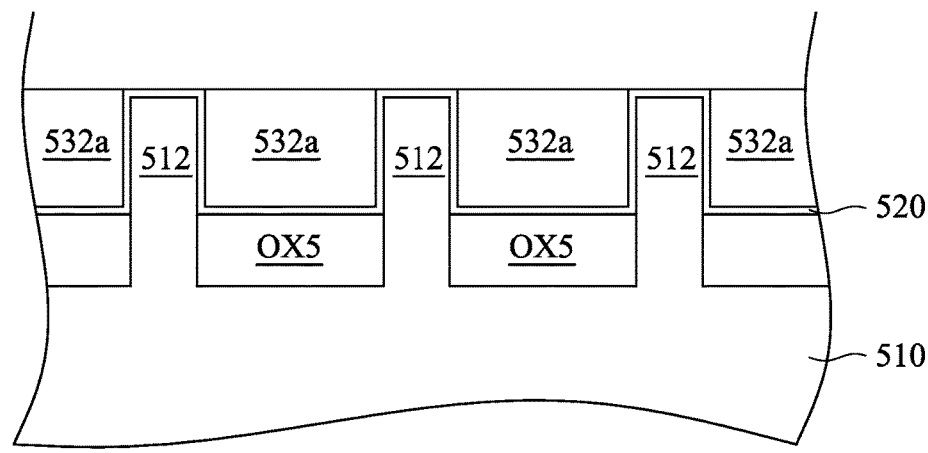

Thereafter, the second portion 532b of the first gate electrode layer 532 is removed to expose portions of the gate dielectric layer 520, as shown in FIG. 5E. In some embodiments, the second portion 532b of the first gate electrode layer 532 is removed by using a wet etching process or a dry etching process. However, embodiments of the present disclosure are not limited thereto.

Figure 5F:
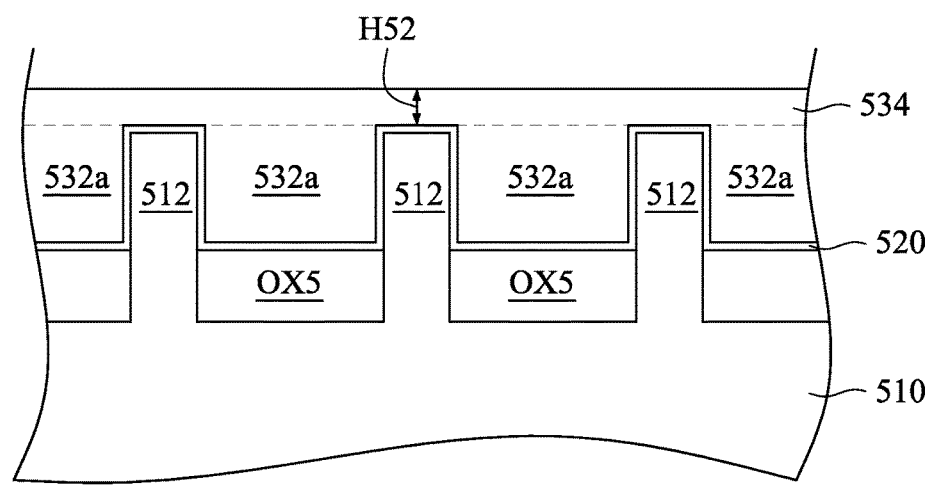

Then, a second gate electrode layer 534 is formed on the first portions 532a of the first gate electrode layer 532, as shown in FIG. 5F. The second gate electrode layer 534 has a thickness H52 which is greater than zero and smaller than or equal to 100 nanometer. In some embodiments, the second gate electrode layer 534 can be formed by using a deposition process, such as an atomic layer deposition (ALD). Other methods to form the second gate electrode layer 534 include chemical vapor deposition (CVD), physical vapor deposition (PVD), and plasma enhanced chemical vapor deposition (PECVD).

Thereafter, a source and a drain (not shown) are formed on the fin portions 512, and contacts formed on the source and the drain, respectively.

Figure 6:
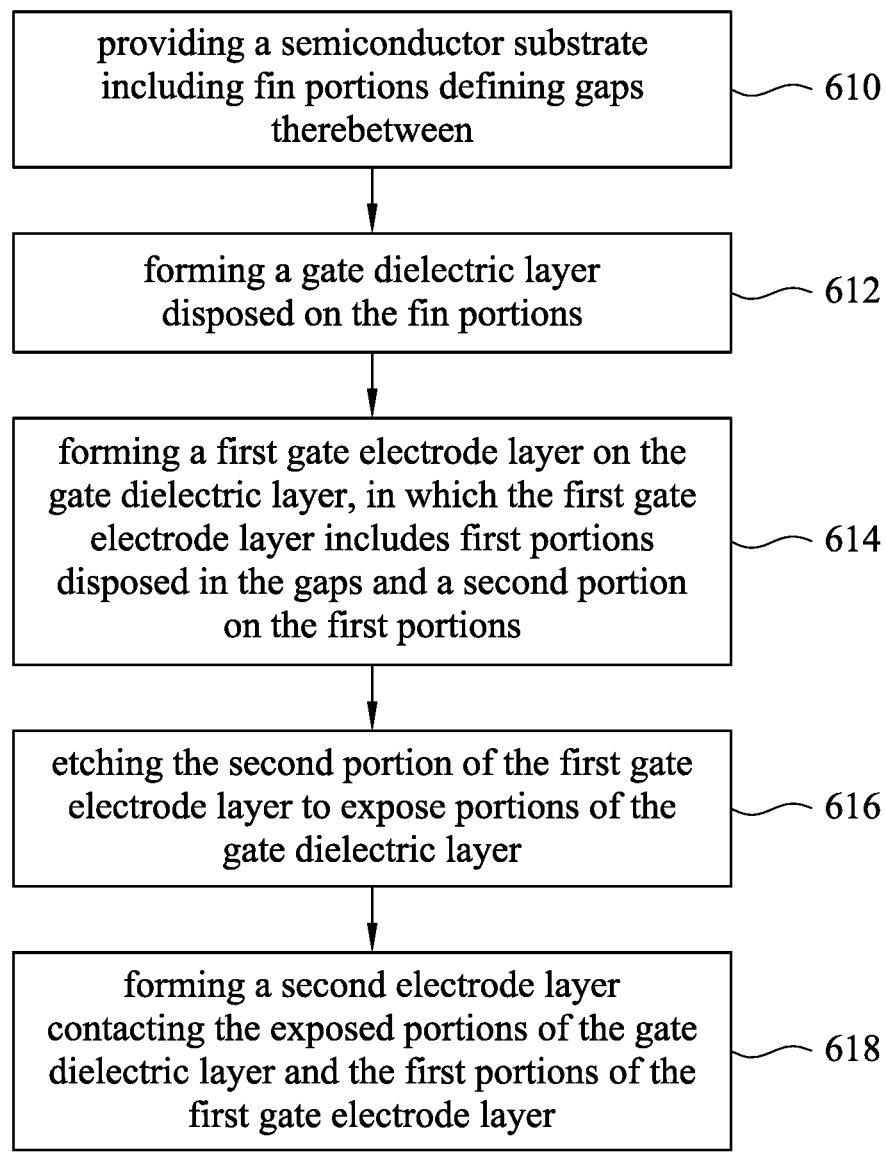
FIG. 6 is a flow chart showing a method for fabricating a semiconductor device in accordance with embodiments of the present disclosure.

Referring to FIG. 6, FIG. 6 is a flow chart showing a method 300 for fabricating a semiconductor device in accordance with embodiments of the present disclosure. The method 600 begins at operation 610. In operation 610, the semiconductor substrate 510 including fin portions 512 is provided as shown in FIG. 5A. The fin portions 512 define plural gaps between the fin portions 512.

Then, in operation 612, the gate dielectric layer 520 is formed on the fin portions 512, as shown in FIG. 5C. In some embodiments, isolation structures can be formed before operation 612 to form the oxide layers OX5 on the semiconductor substrate 510 as shown in FIG. 5B.

Thereafter, in operation 614, the first gate electrode layer 532 is formed on the gate dielectric layer 520, as shown in FIG. 5D. The first gate electrode layer 532 includes the first portions 532a disposed in the gap and the second portion 532b disposed on the first portions 532a.

Then, in operation 616, the second portion 532b of the first gate electrode layer 532 is removed to expose portions of the gate dielectric layer 520, as shown in FIG. 2E.

Thereafter, in operation 618, the second electrode layer 534 is formed on the first portions 532a of the first gate electrode layer 532 and the expose portions of the gate dielectric layer 520, as shown in FIG. 5F. In some embodiments, the second gate electrode layer 534 is formed to have the thickness H52 which is greater than zero and smaller than or equal to 100 nanometer. Then, the source and the drain are formed on the fin portions 512, and the contacts are formed on the source and the drain, respectively.

It can be understood that the gate electrode layer formed on the gate dielectric layer 520 is etched to expose the underlying gate dielectric layer 520, and then regrow to have a suitable thickness (smaller than or equal to 100 nanometer) to decrease capacitances induced between the gate electrode layer and the contacts, thereby decreasing RC delay. Further, the regrowth of the gate electrode layer can be controlled easily.

In accordance with an embodiment of the present disclosure, the present disclosure discloses a semiconductor device. The semiconductor device includes a semiconductor substrate, a gate structure including a gate dielectric layer and a first gate electrode layer, and a second gate electrode layer. The semiconductor substrate includes fin portions defining gaps located between the fin portions. The gate structure is disposed on the fin portions. The gate dielectric layer is disposed on the fin portions. The first gate electrode layer is disposed on the gate dielectric layer, in which the first gate electrode layer comprises a plurality of first portions disposed in the gaps. The second gate electrode layer is disposed on the fin portions and the first gate electrode layer, in which the second gate electrode layer contacts the first gate electrode layer.

In accordance with another embodiment of the present disclosure, the present disclosure discloses a method for fabricating a semiconductor device. In the method, at first, a semiconductor substrate including fin portions is provided, and the fin portions define gaps located between the fin portions. Then, a gate dielectric layer is formed on the fin portions. Thereafter, a first gate electrode layer is formed on the gate dielectric layer, in which the first gate electrode layer includes first portions disposed in the gaps and a second portion on the first portions. Then, the second portion of the first gate electrode layer is etched to expose portions of the gate dielectric layer. Thereafter, a second electrode layer contacting the exposed portions of the gate dielectric layer and the first portions of the first gate electrode layer is formed.

In accordance with another embodiment of the present disclosure, the present disclosure discloses a method for fabricating a semiconductor device. In the method, at first, a semiconductor substrate including fin portions is provided, and the fin portions define gaps located between the fin portions. Then, a gate dielectric layer is formed on the fin portions. Thereafter, a first gate electrode layer is formed on the gate dielectric layer, in which the first gate electrode layer includes first portions disposed in the gaps and a second portion on the first portions. Then, the second portion of the first gate electrode layer is etched to decrease a thickness of the second portion of the first gate electrode layer. Thereafter, a second electrode layer contacting the first gate electrode layer is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   providing a semiconductor substrate comprising a plurality of fin portions defining a plurality of gaps located between the fin portions;
   forming a gate dielectric layer on the fin portions;
   forming a first gate electrode layer on the gate dielectric layer, wherein the first gate electrode layer comprises a plurality of first portions disposed in the gaps and a second portion on the first portions;
   etching the second portion of the first gate electrode layer to decrease a thickness of the second portion of the first gate electrode layer; and
   forming a second gate electrode layer contacting the first gate electrode layer.

2. The method of claim 1, further comprising:
   forming a source on the semiconductor substrate to contact the fin portions;
   forming a drain disposed on the semiconductor substrate to contact the fin portions, wherein the source and the drain are formed at opposite sides of a gate structure;
   forming a first contact on the source, wherein a first capacitance is induced between the first contact and the second gate electrode layer; and
   forming a second contact on the drain, wherein a second capacitance is induced between the second contact and the second gate electrode layer.

3. The method of claim 1, wherein the first gate electrode layer and the second gate electrode layer are formed by using a deposition process.

4. The method of claim 1, wherein a material of the first gate electrode layer is different from a material of the second gate electrode layer.

5. The method of claim 1, wherein the first gate electrode layer and the second gate electrode layer are made by metal.

6. The method of claim 1, further comprising forming a plurality of isolation structures between the fin portions.

7. The method of claim 6, wherein the isolation structures are shallow trench isolations.

8. The method of claim 1, wherein forming the gate dielectric layer on the fin portions is performed by using a deposition process.

9. The method of claim 1, wherein forming the second electrode layer contacting the first gate electrode layer is performed by using a deposition process.

10. The method of claim 1, wherein the first electrode layer is made by tungsten (W), cobalt (Co), copper (Cu), titanium (Ti), tantalum (Ta), titanium nitride (TiN), tantalum nitride (TaN) and silicide.

11. A method for fabricating a semiconductor device, the method comprising:
    providing a semiconductor substrate comprising a plurality of fin portions;
    forming a gate dielectric layer on the fin portions, wherein the dielectric layer is conformal to the fin portions;
    forming a first gate electrode layer covering the gate dielectric layer;
    etching the first gate electrode layer to decrease a thickness of the first gate electrode layer; and
    forming a second gate electrode layer contacting the first gate electrode layer.

12. The method of claim 11, wherein the first gate electrode layer and the second gate electrode layer are formed by using a deposition process.

13. The method of claim 11, wherein a material of the first gate electrode layer is different from a material of the second gate electrode layer.

14. The method of claim 11, wherein the first gate electrode layer and the second gate electrode layer are made by metal.

15. The method of claim 11, further comprising forming a plurality of isolation structures between the fin portions.

16. A method for fabricating a semiconductor device, the method comprising:

providing a semiconductor substrate comprising a plurality of fin portions defining a plurality of first gaps located between the fin portions;

forming a gate dielectric layer on the fin portions, wherein portions of the gate dielectric layer are formed in the first gaps to define a plurality of second gaps;

filling the second gaps with a metal material to form a first gate electrode layer on the gate dielectric layer, wherein the first gate electrode layer comprises a plurality of first portions disposed in the second gaps and a second portion on the first portions;

etching the second portion of the first gate electrode layer to decrease a thickness of the second portion of the first gate electrode layer; and forming a second gate electrode layer contacting the first gate electrode layer.

17. The method of claim 16, wherein the first gate electrode layer and the second gate electrode layer are formed by using a deposition process.

18. The method of claim 16, wherein a material of the first gate electrode layer is different from a material of the second gate electrode layer.

19. The method of claim 16, wherein the metal material is tungsten (W), cobalt (Co), copper (Cu), titanium (Ti), tantalum (Ta), titanium nitride (TiN), tantalum nitride (TaN) and silicide.

20. The method of claim 17, wherein the deposition process is atomic layer deposition (ALD), chemical vapor deposition (CVD), physical vapor deposition (PVD), or plasma enhanced chemical vapor deposition.

* * * * *